(12) United States Patent
Choi et al.

(10) Patent No.: US 11,476,215 B2
(45) Date of Patent: Oct. 18, 2022

(54) SEMICONDUCTOR PACKAGE

(71) Applicant: SAMSUNG ELECTRONICS CO., LTD., Suwon-si (KR)

(72) Inventors: Jae Hoon Choi, Suwon-si (KR); Doo Hwan Lee, Suwon-si (KR); Joo Young Choi, Suwon-si (KR); Sung Han, Suwon-si (KR); Byung Ho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1 day.

(21) Appl. No.: 17/243,889

(22) Filed: Apr. 29, 2021

(65) Prior Publication Data

US 2021/0265296 A1 Aug. 26, 2021

Related U.S. Application Data

(63) Continuation of application No. 16/294,083, filed on Mar. 6, 2019, now Pat. No. 11,011,485.

(30) Foreign Application Priority Data

Sep. 13, 2018 (KR) .......................... 10-2018-0109782

(51) Int. Cl.
*H01L 23/00* (2006.01)
*H01L 23/31* (2006.01)
(Continued)

(52) U.S. Cl.
CPC .............. *H01L 24/08* (2013.01); *H01L 23/13* (2013.01); *H01L 23/3128* (2013.01);
(Continued)

(58) Field of Classification Search
CPC ..... H01L 24/08; H01L 23/13; H01L 23/3128; H01L 23/3135; H01L 23/3171;
(Continued)

(56) References Cited

U.S. PATENT DOCUMENTS 9,799,615 B1\* 10/2017 Huang .................... H01L 24/97
9,799,619 B2\* 10/2017 Jin .......................... H01L 24/02
(Continued)

FOREIGN PATENT DOCUMENTS

JP 2012-186296 A 9/2012
KR 10-2014-0035652 A 3/2014
(Continued)

OTHER PUBLICATIONS

Communication dated Nov. 29, 2019, issued by the Taiwanese Patent Office in counterpart Taiwanese Application No. 108106967.

*Primary Examiner* — Jose R Diaz
(74) *Attorney, Agent, or Firm* — Sughrue Mion, PLLC

(57) ABSTRACT

A method of manufacturing a semiconductor package is provided and includes forming a protective layer on a passivation layer and a connection pad of a semiconductor chip exposed by a first opening of the passivation layer, forming an insulating layer on the protective layer, forming a via hole penetrating the insulating layer to expose the protective layer, forming a second opening by removing a portion of the protective layer through the via hole, and forming a connection via filling the via hole and the second opening and a redistribution layer on the connection via. The second opening and the via hole are connected to have a stepped portion. The first opening has a width narrower closer to the connection pad, and the second opening has a width wider closer to the connection pad.

20 Claims, 12 Drawing Sheets

(51) Int. Cl.
*H01L 23/498* (2006.01)
*H01L 23/13* (2006.01)
*H01L 23/538* (2006.01)

(52) U.S. Cl.
CPC ...... *H01L 23/3135* (2013.01); *H01L 23/3171* (2013.01); *H01L 23/49822* (2013.01); *H01L 23/49838* (2013.01); *H01L 23/49894* (2013.01); *H01L 23/5384* (2013.01); *H01L 2224/023* (2013.01); *H01L 2224/0221* (2013.01); *H01L 2224/08235* (2013.01)

(58) Field of Classification Search
CPC ......... H01L 23/49822; H01L 23/49838; H01L 23/49894
See application file for complete search history.

(56) References Cited

U.S. PATENT DOCUMENTS

| | | | |
|---|---|---|---|
| 9,837,359 | B1 | 12/2017 | Chiu et al. |
| 9,905,509 | B2 | 2/2018 | Chen et al. |
| 9,972,581 | B1* | 5/2018 | Yu ........................ H01L 21/568 |
| 10,373,887 | B2 | 8/2019 | Ha et al. |
| 2012/0222894 | A1 | 9/2012 | Kaneko et al. |
| 2018/0082917 | A1 | 3/2018 | Cheng et al. |
| 2018/0090402 | A1 | 3/2018 | Kim et al. |
| 2018/0108639 | A1 | 4/2018 | Kang et al. |

FOREIGN PATENT DOCUMENTS

| | | |
|---|---|---|
| KR | 10-2018-0043071 A | 4/2018 |
| TW | 201824471 A | 7/2018 |
| TW | 201826408 A | 7/2018 |

* cited by examiner

SEMICONDUCTOR PACKAGE

CROSS-REFERENCE TO RELATED APPLICATION

This application is a continuation application of U.S. application Ser. No. 16/294,083, filed Mar. 6, 2019, which claims the benefit of priority to Korean Patent Application No. 10-2018-0109782, filed on Sep. 13, 2018 with the Korean Intellectual Property Office, the entire contents of each of which are herein incorporated by reference in their entireties.

TECHNICAL FIELD

The present disclosure relates to a semiconductor package, for example, to a fan-out semiconductor package.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded. One type of package technology suggested to satisfy the technical demand described above is a fan-out package. Such a fan-out package has a compact size and may allow a plurality of pins to be implemented by redistributing connection terminals outwardly of a region in which a semiconductor chip is disposed.

On the other hand, in the case of a semiconductor chip, aluminum (Al) or copper (Cu) is used as a material of the connection pad. In this case, in the process for manufacturing a package, the connection pads of the semiconductor chip may be exposed to air, moisture, a chemical solution, or the like, which may cause corrosion and damage.

SUMMARY

An aspect of the present disclosure provides a novel semiconductor package structure for significantly reducing corrosion and damage of a connection pad of a semiconductor chip, and improving reliability of a connection via and reducing resist distribution.

According to an aspect of the present disclosure, in a chip state before packaging a semiconductor chip, a protective film is formed on a passivation film having an opening exposing a connection pad of a semiconductor chip. Moreover, when a via hole is formed in an insulating layer in an operation of packaging a semiconductor chip, an undercut is formed in the protective film.

According to an aspect of the present disclosure, a semiconductor package includes: a semiconductor chip having an active surface on which a connection pad is disposed and an inactive surface opposite to the active surface, and including a passivation film disposed on the active surface and having a first opening exposing at least a portion of the connection pad and a protective film disposed on the passivation film, filling at least a portion in the first opening, and having a second opening exposing at least a portion of the connection pad in the first opening; an encapsulant covering at least a portion of the semiconductor chip; and the connection structure including an insulating layer disposed on the protective film, and having a via hole connected to the second opening to expose at least a portion of the connection pad, a redistribution layer disposed on the insulating layer, and a connection via connecting the connection pad to the redistribution layer while filling at least a portion of each of the via hole and the second opening. The second opening and the via hole are connected to have a stepped portion.

According to an aspect of the present disclosure, a semiconductor package includes: a semiconductor chip having an active surface on which a connection pad is disposed and an inactive surface opposite to the active surface; an encapsulant covering at least a portion of the semiconductor chip; and a connection structure including an insulating layer disposed on the semiconductor chip, a redistribution layer disposed on the insulating layer, and a connection via connecting the connection pad to the redistribution layer. The connection via has a portion having a width smaller than a width of an uppermost portion of the connection via in contact with the connection pad and a width of a lowermost portion of the connection via in contact with the redistribution layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
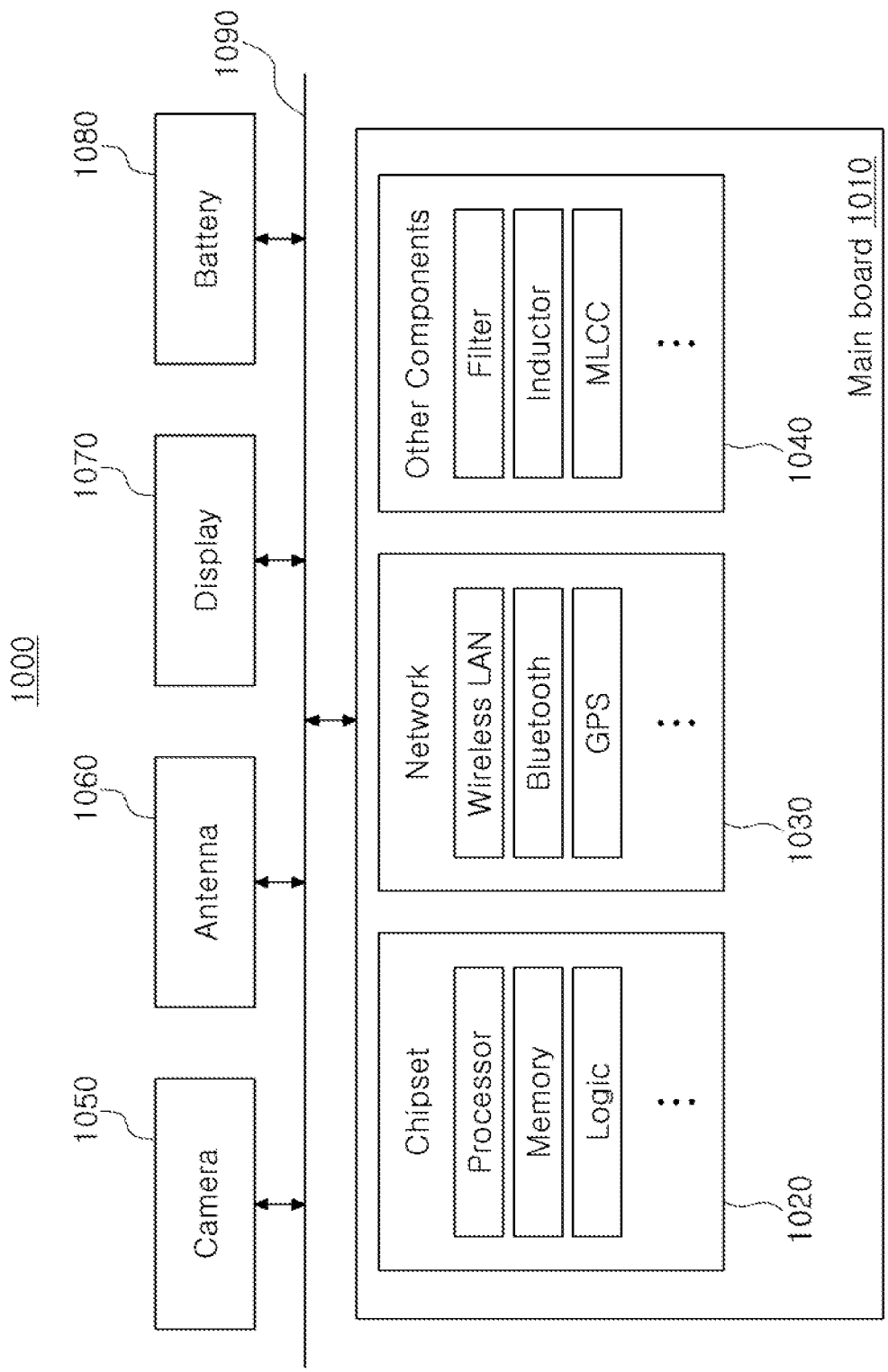
FIG. 1 is a block diagram schematically illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' 'upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

Electronic Device

FIG. 1 is a schematic block diagram illustrating an example of an electronic device system.

Referring to FIG. 1, an electronic device 1000 may receive a motherboard 1010. The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
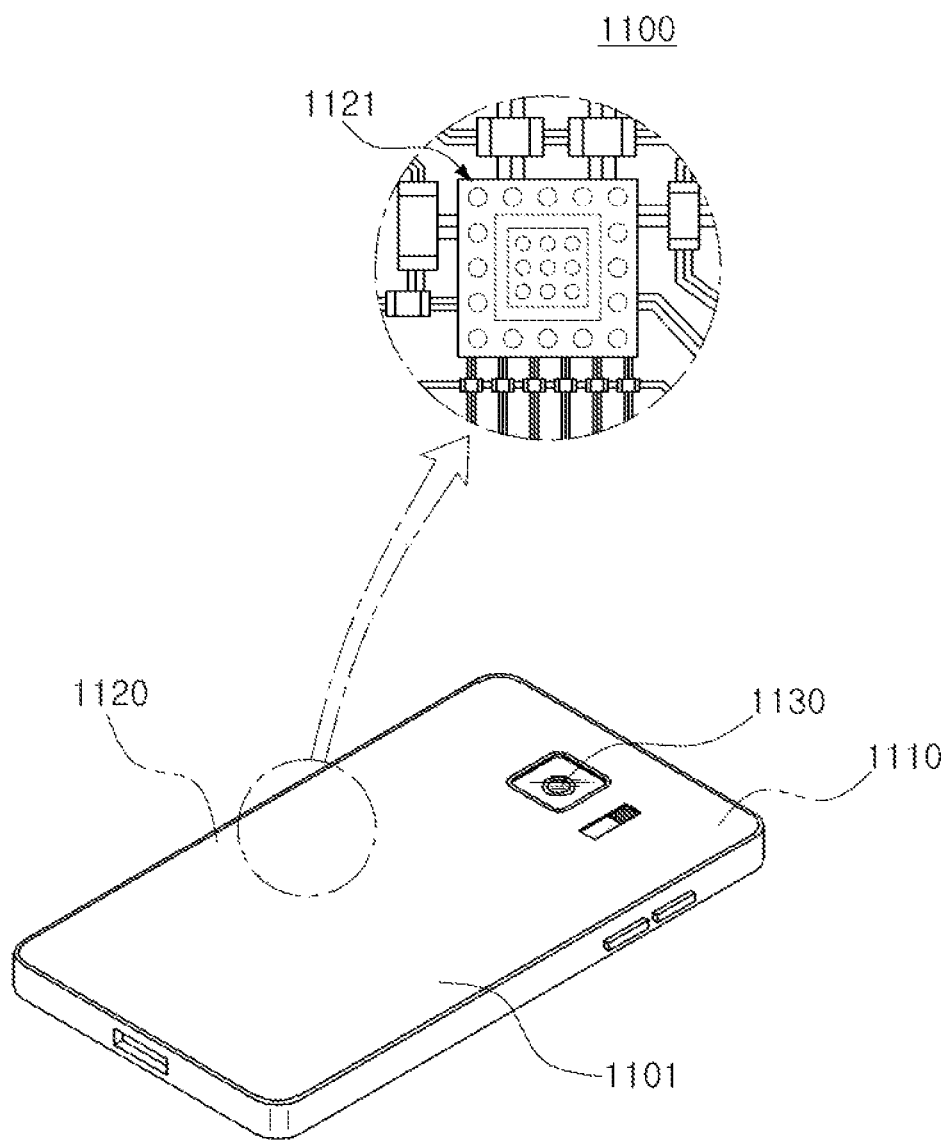
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a main board may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
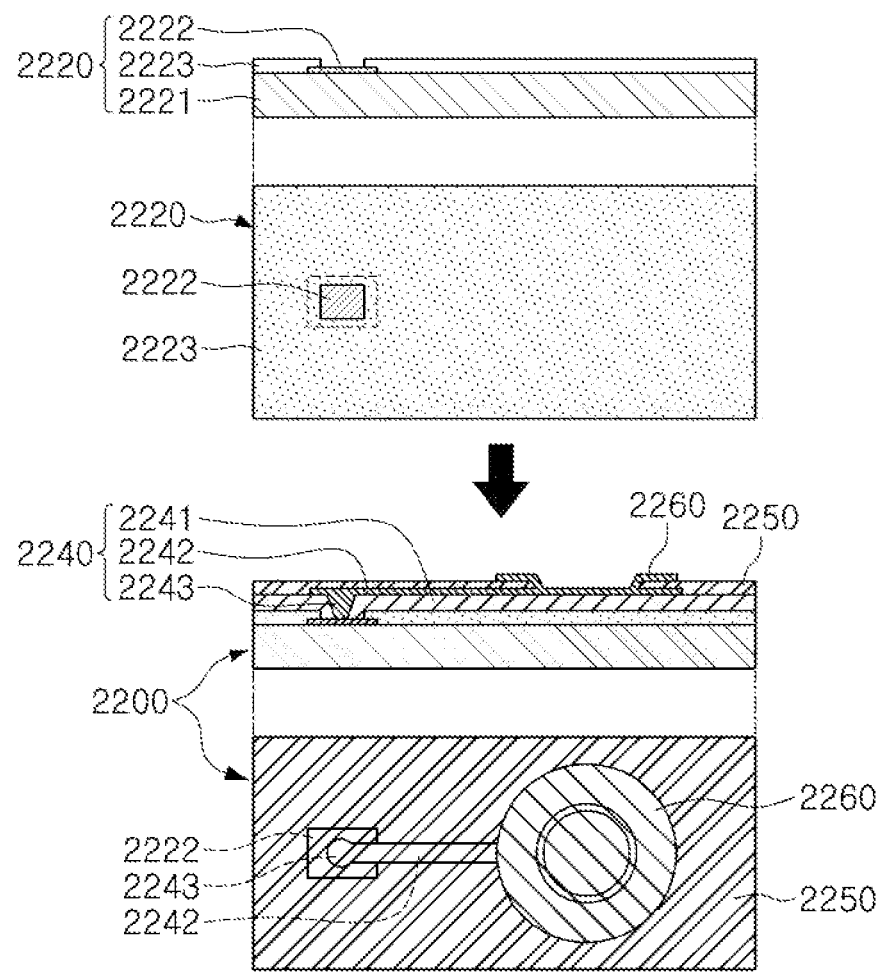
FIGS. 3A and 3B are schematic cross-sectional views illustrating states of a fan-in semiconductor package before and after being packaged.
Figure 3B:
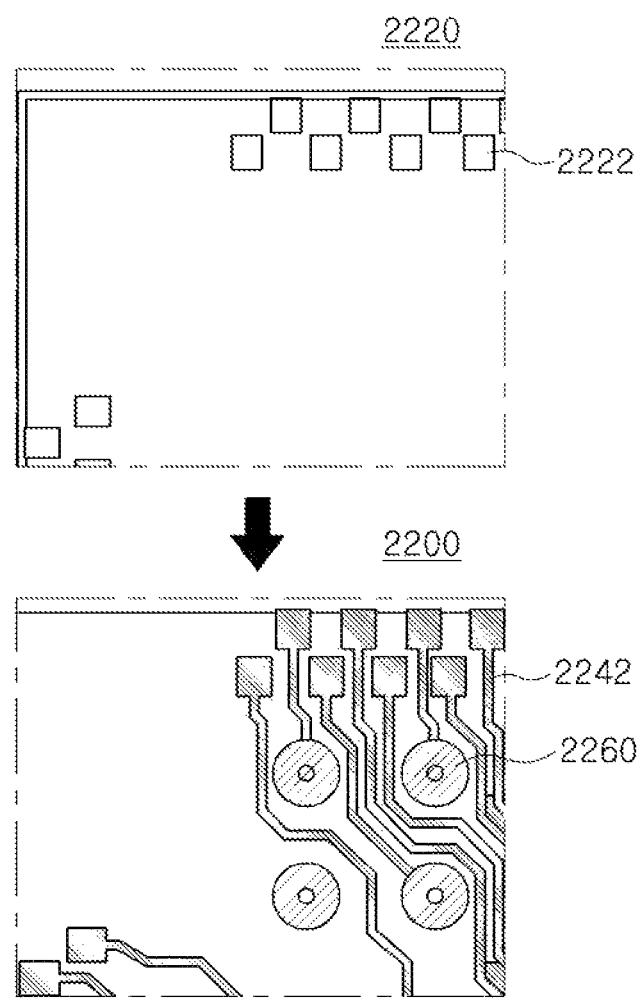

FIGS. 3A and 3B are schematic cross-sectional views illustrating states of a fan-in semiconductor package before and after being packaged.

Figure 4:
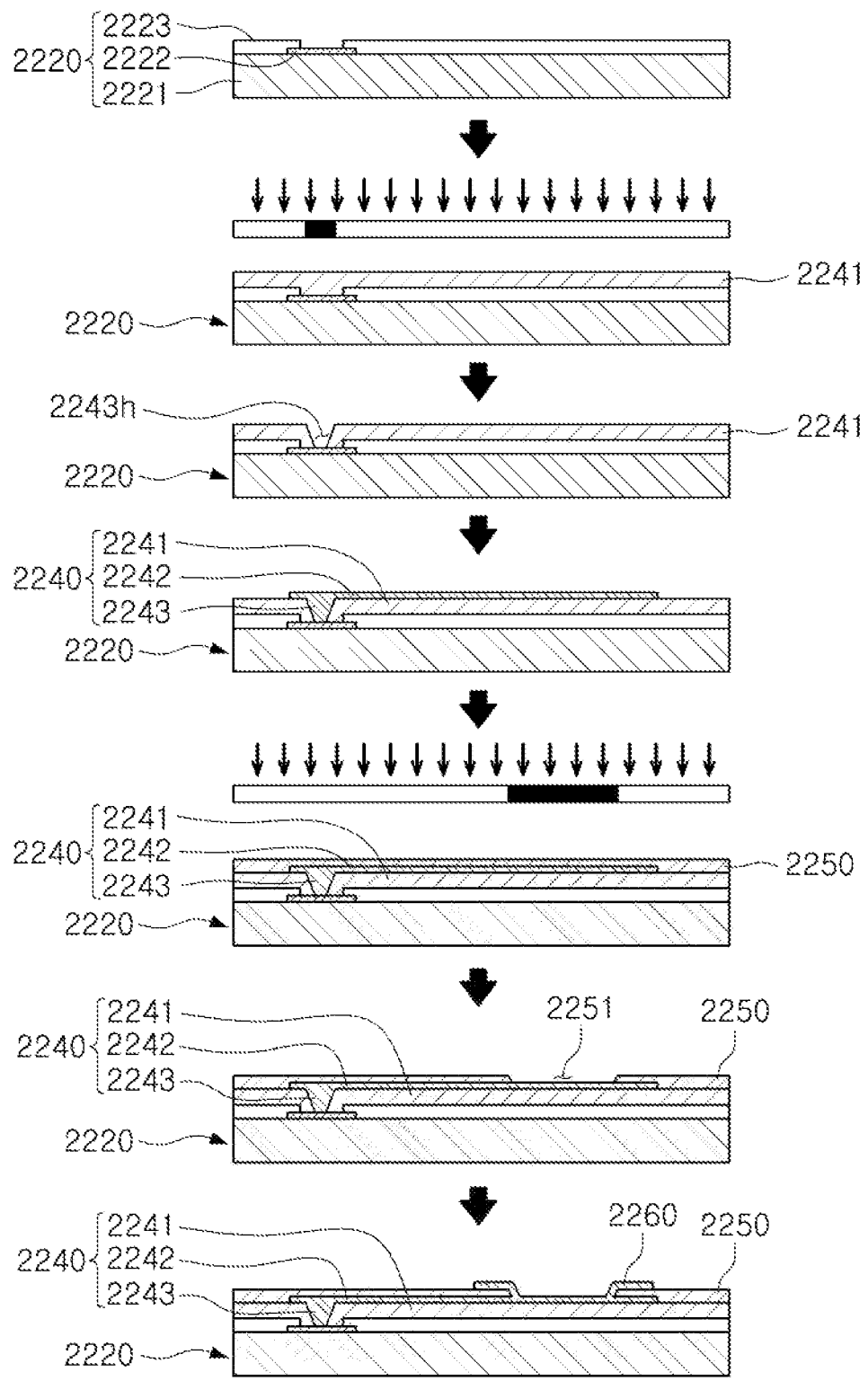
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A, 3B, and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a metallic material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal 2260, or the like, may be formed. That is, a fan-in semiconductor package 2200 including, for example, the semiconductor chip 2220, the connection structure 2240, the passivation layer 2250, and the underbump metal 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
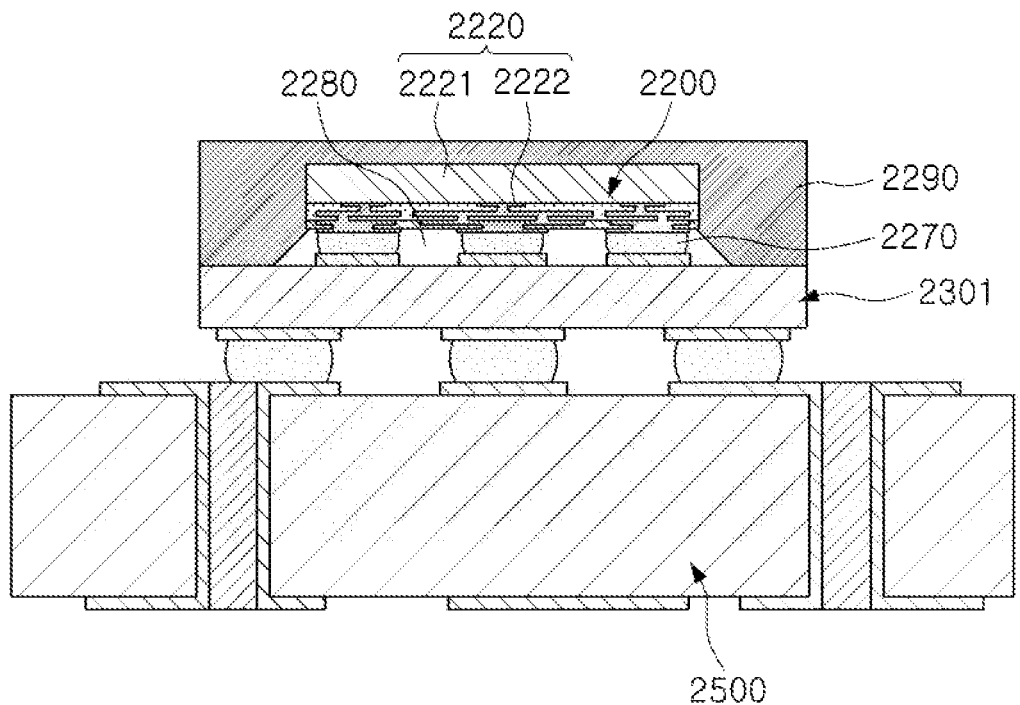
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board and is ultimately mounted on a mainboard of an electronic device.

Figure 6:
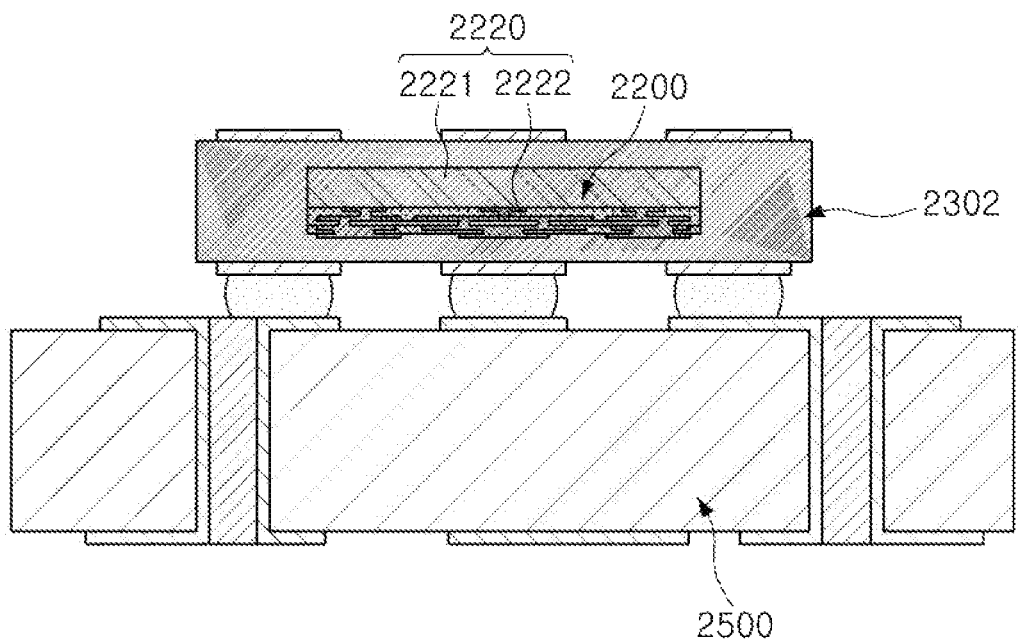
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may ultimately be mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
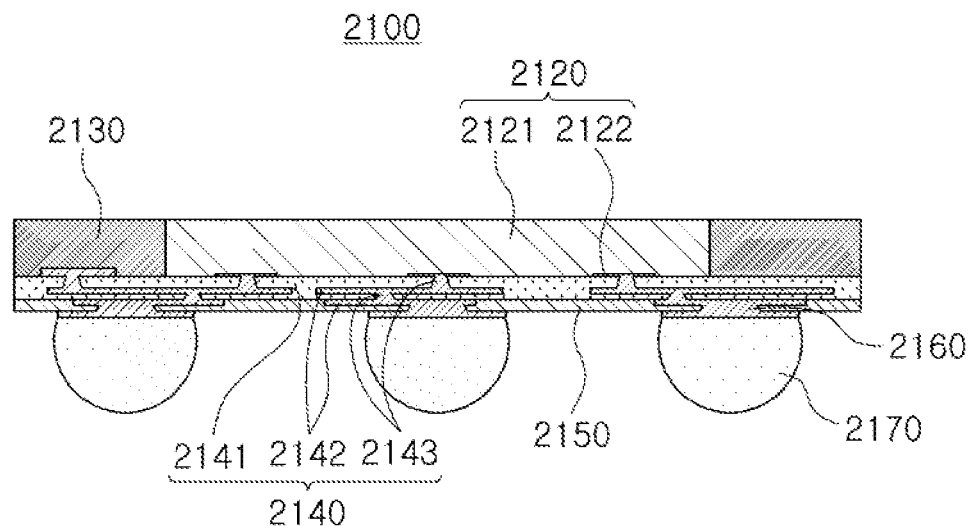
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal 2160 may further be formed in openings of the passivation layer 2150. Solder balls 2170 may further be formed on the underbump metal 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2141, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
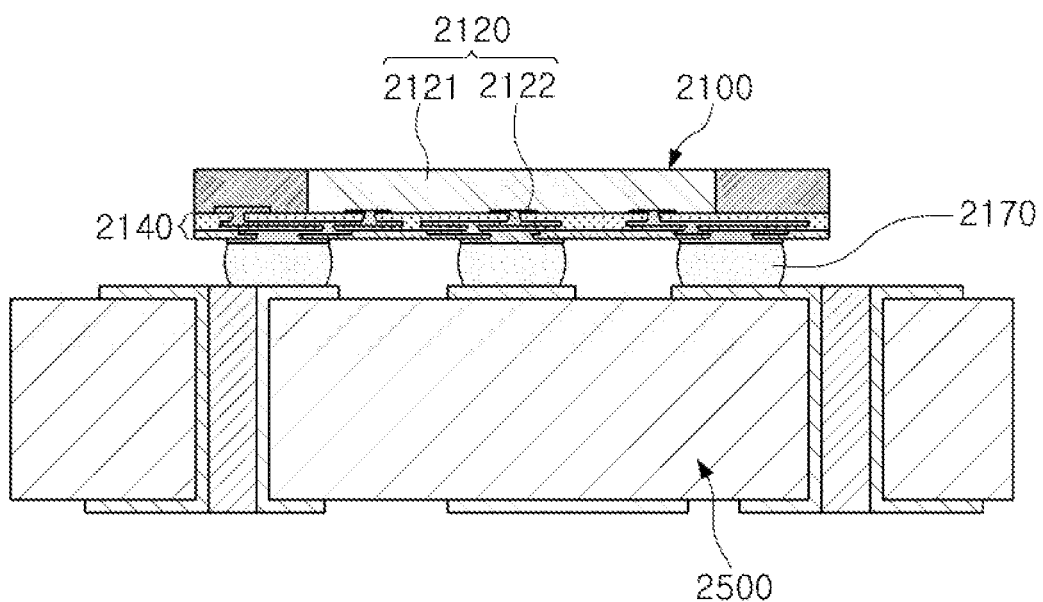
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is conceptually different from a printed circuit board (PCB) such as a printed circuit board, or the like, having a scale, a purpose, and the like, different from those of the fan-out semiconductor package, and having the fan-in semiconductor package embedded therein.

Hereinafter, a novel semiconductor package structure, capable of significantly reducing the corrosion and damage of a connection pad of a semiconductor chip will be described with reference to the drawings.

Figure 9:
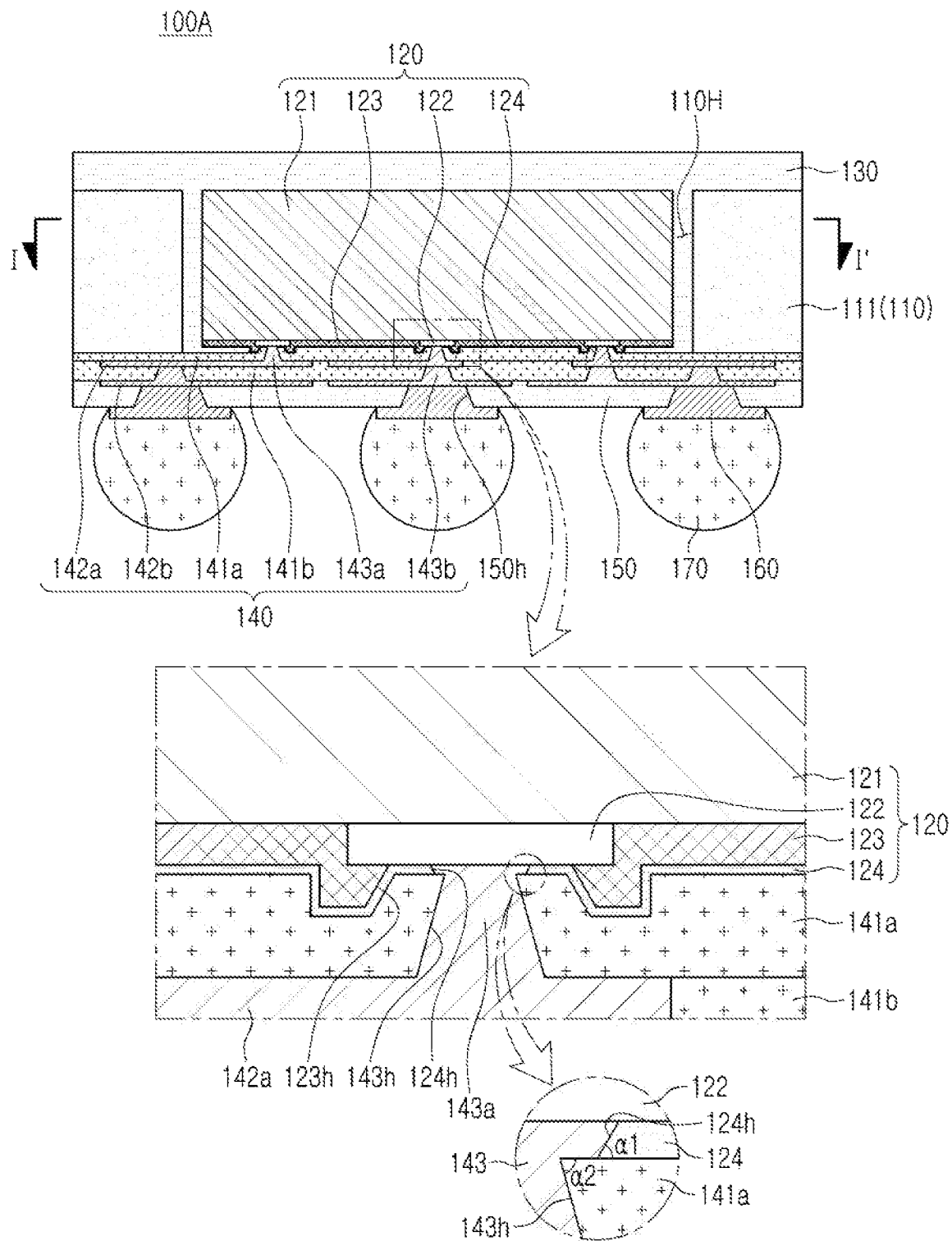
FIG. 9 is a schematic cross-sectional view illustrating an example of a semiconductor package.

FIG. 9 is a schematic cross-sectional view illustrating an example of a semiconductor package.

Figure 10:
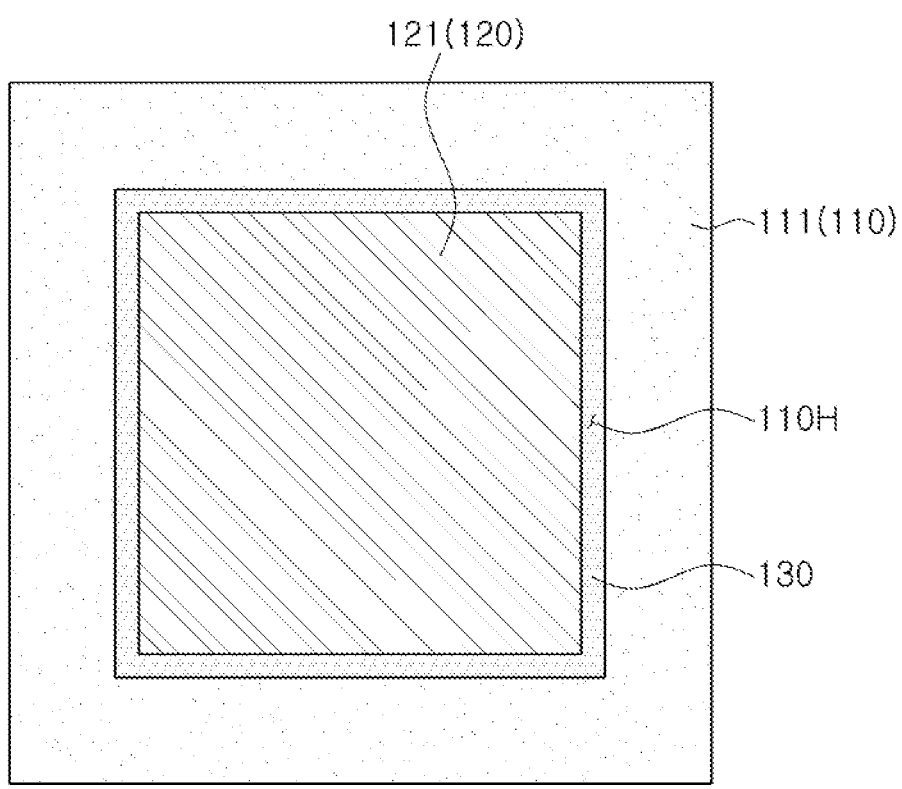
FIG. 10 is a schematic plan view taken along line I-I' of the semiconductor package of FIG. 9.

FIG. 10 is a schematic plan view taken along line I-I' of the semiconductor package of FIG. 9.

Referring to FIG. 9, a semiconductor package 100A according to an example may include a semiconductor chip 120 having an active surface on which a connection pad 122 is disposed and an inactive surface opposite to the active surface, and including a passivation film 123 disposed on the active surface and having a first opening 123h, exposing at least a portion of the connection pad 122, and a protective film 124 disposed on the passivation film 123, filling at least a portion in the first opening 123h, and having a second opening 124h exposing at least a portion of the connection pad 122 in the first opening 123h, an encapsulant 130 covering at least a portion of the semiconductor chip 120, and a connection structure 140 including a first insulating layer 141a disposed on the protective film 124 and having a via hole 143h connected to the second opening 124h and exposing at least a portion of the connection pad 122, a first redistribution layer 141b disposed on the first insulating layer 141a, and a first connection via 143a filling at least a portion of each of the via hole 143h and the second opening 124h, and connecting the connection pad 122 to the first redistribution layer 142a. In this case, the second opening 124h and the via hole 143h are connected to have a stepped portion. For example, a predetermined undercut is provided to the protective film 124, so a wall surface of the second opening 124h is recessed toward a wall surface of the first opening 123h. The recessed region is disposed between the first insulating layer 141a and the connection pad 122, and the first connection via 143a may fill at least a portion of the recessed region.

Meanwhile, in the case of the semiconductor chip 120, a material of the connection pad 122 is usually aluminum (Al) or copper (Cu). In this case, in a process for manufacturing a package 100A, if no action is taken, the connection pad 122 of the semiconductor chip 120 may be exposed to air, moisture, a chemical solution, or the like. Thus, a problem in which corrosion and damage are caused may occur. In detail, when the first connection via 143a is directly formed on the semiconductor chip 120 without any action, before the first insulating layer 141a, commonly containing a photoimageable dielectric (PID) material is applied, organic and oxidized layers on a surface of the connection pad 122 are removed through a chemical treatment. In this case, the connection pad 122 may be damaged by the chemical treatment. Moreover, by a PID developer, in a formation process of the via hole 143h, the connection pad 122 is also damaged. The damage described above may allow corrosion of the connection pad 122 to occur and may make surface roughness of the connection pad 122 to be tough. Thus, a seed layer for formation of the first connection via 143a is allowed to be uneven, so corrosion of the connection pad 122 may be caused when a package process is performed thereafter.

On the other hand, in a manner similar to the semiconductor package 100A according to an example, when the protective film 124 having the second opening 124h with a width, smaller than a width of the first opening 123h, is formed on the passivation film 123 having the first opening 123h, a region excluding a region exposed by the second opening 124h, of a region exposed by the first opening 123h of the connection pad 122, may be covered by the protective film 124. In this regard, in a process for manufacturing the package 100A, it may be significantly reduced that the connection pad 122 is exposed by air, moisture, a chemical solution, or the like, so corrosion and damage may be significantly reduced. Here, a width indicates a width in a cross-sectional view such as FIG. 9. When a corresponding opening is tapered, the width indicates is a widest width.

In detail, the protective film 124 may serve as a barrier from oxidation and corrosion of the connection pad 122, which may occur in a process for forming the first insulating layer 141a of the connection structure 140. Thereafter, after a via hole 143h is formed in the first insulating layer 141a, the protective film 124 in a region of the via hole 143h is only selectively removed to connect the via hole 143h to the second opening 124h. Thus, an electrical connection path through the first connection via 143a is easily provided. In other words, despite the introduction of the first insulating layer 141a, such as a PID, or the like, for formation of the first redistribution layer 142a in a manner similar to the related art, oxidation and corrosion of the connection pad 122 through the protective film 124 may be significantly reduced. In this case, the first insulating layer 141a may be physically spaced apart from the connection pad 122 by the protective film 124, and the first insulating layer 141a may fill at least a portion of a space between the protective film 124 and the first connection via 143a in the first opening 123h.

In detail, the second opening 124h and the via hole 143h are connected to have a stepped portion. For example, the protective film 124 and the first insulating layer 141a may include different materials. In a process in which a via hole 143h is formed in the first insulating layer 141a and then the protective film 124 in a region of the via hole 143h is selectively removed, a predetermined undercut may be provided in a formation region of the second opening 124h of the protective film 124. In other words, in a connection point of the second opening 124h and the via hole 143h, a width of the second opening 124h may be wider than a width of the via hole 143h. As a result, a wall surface of the second opening 124h is recessed toward a wall surface of the first opening 123h, the recessed region is disposed between the first insulating layer 141a and the connection pad 122, and the first connection via 143a may fill at least a portion of the recessed region. Thus, the first connection via 143a may have a portion having a width smaller than a width of an uppermost portion of the first connection via 143a in contact with the connection pad 122 and a width of a lowermost portion of the first connection via 143a in contact with the first redistribution layer 142a. In this case, a contact area of the first connection via 143a is widened, and an anchor effect due to a stepped portion is also provided. In this regard, reliability of the first connection via 143a connected to the connection pad 122 may be improved, and resist distribution may also be reduced.

On the other hand, the second opening 124h may be tapered to have a predetermined inclination α1 with respect to an interface, parallel to a lower surface of the connection pad 122, between the protective film 124 and the first insulating layer 141a, and the via hole 143h may also be tapered to have a predetermined inclination α2 with respect to the interface, parallel to the lower surface of the connection pad 122, between the protective film 124 and the first insulating layer 141a. In this case, the second opening 124h and the via hole 143h may be tapered in opposite directions. In other words, the second opening 124h may have a wider width closer to the connection pad 122, and the via hole 143h may have a narrower width closer to the connection pad 122. In this case, the first connection via 143a may include a first portion filling the second opening 124h and a second portion filling the via hole 143h. The first portion and the second portion of the first connection via 143a may be tapered in opposite directions. As described above, when the second opening 124h and the via hole 143h are tapered in opposite directions, an anchor effect due to the stepped portion described above may be further significantly increased, and a contact area may be further widened. Thus, reliability of the first connection via 143a may be further improved, and resist distribution may be significantly reduced.

Meanwhile, the protective film 124 is preferably formed on the passivation film 123 having the first opening 123h exposing the connection pad 122 of the semiconductor chip 120 in a chip state, before the semiconductor chip 120 is packaged. In this case, the protective film 124 is formed on the passivation film 123 as described above, and the protective film 124 is also disposed in a region inside the active surface of the semiconductor chip 120. Moreover, the encapsulant 130 may cover not only a side surface of the passivation film 123, but also a side surface of the protective film 124. Moreover, the encapsulant 130 may fill a portion between the protective film 124 and the first insulating layer 141a of the connection structure 140. As described above, as the protective film 124 is formed in a chip state, for example, a wafer state, a good product is only selected before packaging, so a yield may be increased. Furthermore, it is not necessary to form the protective film 124 even to other components such as the encapsulant 130 or the frame 110, so a process may be simplified and costs may be reduced. In addition, contamination of the connection pad 122 may be significantly reduced more effectively.

The respective components included in the semiconductor package 100A according to the exemplary embodiment will hereinafter be described in more detail.

The frame 110, as an additional component, may improve rigidity of the fan-out semiconductor package 100A depending on certain materials of the insulating layer 111, and serve to secure uniformity of a thickness of the encapsulant 130. The frame 110 may have a through-hole 110H, passing through the insulating layer 111. In the through-hole 110H, the semiconductor chip 120 is disposed, and a passive component (not shown) may be disposed together as required. The through-hole 110H may have a form with a wall surface surrounding the semiconductor chip 120, but is not limited thereto.

A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, a material in which the thermosetting resin or the thermoplastic resin is impregnated together with an inorganic filler in a core material such as a glass fiber (or a glass cloth or a glass fabric), for example, copper clad laminate (CCL), unclad copper clad laminate (CCL Unclad), a prepreg, or the like, but is not limited thereto. If necessary, a material of the insulating layer 111 may be a glass, ceramics, or the like. A lower surface of the insulating layer 111 is coplanar with a lowermost surface of the protective film 124 of the semiconductor chip 120. In this regard, because the protective film 124 is formed in a chip state.

Meanwhile, although not illustrated in the drawings, if necessary, for the purpose of electromagnetic shielding or for heat dissipation, a metal layer (not shown) may be disposed on a wall surface of the through-hole 110H of the frame 110, and the metal layer (not shown) may surround the semiconductor chip 120.

The semiconductor chip 120 may be an integrated circuit (IC) provided in an amount of several hundred to several million or more elements integrated in a single chip. In this case, the IC may be, for example, an application processor chip such as a central processor (for example, a CPU), a graphics processor (for example, a GPU), a digital signal processor, a cryptographic processor, a microprocessor, a microcontroller, or the like, but is not limited thereto. Here, the IC may be a Power Management IC (PMIC), a memory chip such as a volatile memory (e.g., DRAM), a non-volatile memory (e.g., ROM), a flash memory, or an analog-to-digital converter, or a logic chip such as an application-specific IC (ASIC).

The semiconductor chip 120 may be an integrated circuit in a bare state in which a separate bump or a wiring layer is not provided. However, it is not limited thereto, and the semiconductor chip may be a package-type integrated circuit, if necessary. The integrated circuit may be provided based on an active wafer. In this case, a base material of a body 121 of the semiconductor chip 120 may be silicon (Si), germanium (Ge), gallium arsenide (GaAs), or the like. Various circuits may be formed on the body 121.

The connection pads 122 may electrically connect the semiconductor chip 120 to other components. A material of each of the connection pads 122 may be a metallic material such as aluminum (Al), copper (Cu), or the like, without limitation. A passivation film 123 having the first opening 123h exposing at least a portion of the connection pad 122 is formed on the body 121, and the passivation film 123 may be an oxide film or a nitride film. Although the passivation film 123 is illustrated in having a thickness similar to a thickness of the connection pad 122, it is not limited thereto. Alternatively, the passivation film 123 may have a thickness thinner than a thickness of the connection pad 122. A protective film 124, filling at least a portion in the first opening 123h, and having a second opening 124h exposing at least a portion of the connection pad 122 in the first opening 123h, may be formed on the passivation film 123, and the protective film 124 may also be an oxide film or a nitride film, the same as or different from the passivation film 123. In detail, the protective film 124 may be formed of a thin film having insulating properties, for example, $SiO_2$, SiN, $TiO_2$, ZnO, $Al_2O_3$, other polymers, and a thickness thereof may be thinner than the passivation film 123, for example, about 1 nm to about 500 nm. An insulating film (not shown) such as SiO may be further disposed in other required locations, for example, in spaces among the body 121, the connection pad 122, and the passivation film 123. Meanwhile, in the semiconductor chip 120, a side, on which connection pad 122 is disposed, is an active surface, and the opposite side is an inactive surface.

The encapsulant 130 may cover at least a portion of the semiconductor chip 120. When the frame 110 is provided, the encapsulant 130 may cover at least a portion of the frame 110. Moreover, the encapsulant 130 may fill at least a portion of the through-hole 110H. The encapsulant 130 may include an insulating material. The insulating material may be a material containing an inorganic filler and an insulating resin, for example, a thermosetting resin such as an epoxy resin, a thermoplastic resin such as a polyimid, or a resin in which a reinforcing material such as an inorganic filler is contained in the thermosetting resin or the thermoplastic resin, in detail, an Ajinomoto Build-up Film (ABF), an FR-4 resin, a bismaleimide triazine (BT) resin, a resin, or the like. Moreover, a molding material such as EMC may be used, or a photosensitive material, that is, a photo imageable encapsulant (PIE) may be used, as needed. As needed, a material in which an insulating resin such as the thermosetting resin or the thermoplastic resin is impregnated in a core material such as an inorganic filler and/or a glass fiber (or a glass cloth or a glass fabric), may be used.

Meanwhile, the protective film 124 is preferably formed on the passivation film 123 having the first opening 123h exposing the connection pad 122 of the semiconductor chip 120 in a chip state, before the semiconductor chip 120 is packaged. In this case, the protective film 124 is formed on the passivation film 123 as described above, and the protective film 124 is also disposed in a region inside the active surface of the semiconductor chip 120. Moreover, the encapsulant 130 may cover not only a side surface of the passivation film 123, but also a side surface of the protective film 124. Moreover, the encapsulant 130 may fill a portion between the protective film 124 and the first insulating layer 141a of the connection structure 140. As described above, as the protective film 124 is formed in a chip state, for example, a wafer state, only a good product is selected before packaging, so yield may be increased. Furthermore, it is not necessary to form the protective film 124 even to other components such as the encapsulant 130 or the frame 110, so a process may be simplified and costs may be reduced. In addition, contamination of the connection pad 122 may be significantly reduced more effectively.

The connection structure 140 may redistribute the connection pads 122 of the semiconductor chip 120. Several tens to several thousands of connection pads 122 of the semiconductor chip 120 having various functions may be redistributed by the connection structure 140, and may be physically or electrically externally connected through the electrical connection metal 170 depending on functions. The connection structure 140 includes a first insulating layer 141*a* disposed on an active surface of the semiconductor chip 120 and having a via hole 143*h* connected to the second opening 124*h* and exposing at least a portion of the connection pad 122 in the second opening 124*h*, a first redistribution layer 142*a* disposed on the first insulating layer 141*a*, a first connection via 143*a* filling at least a portion of each of the via hole 143*h* and the second opening 124*h* and electrically connecting the connection pad 122 to the first redistribution layer 142*a*, a second insulating layer 141*b* disposed on the first insulating layer 141*a* and covering at least a portion of the first redistribution layer 142*a*, a second redistribution layer 142*b* disposed on the second insulating layer 141*b*, and a second connection via 143*b* passing through the second insulating layer 141*b* and electrically connecting the first redistribution layer 142*a* to the second redistribution layer 142*b*. These described above may be more or less than those illustrated in the drawings.

A material of the first insulating layer 141*a* and the second insulating layer 141*b* may be an insulating material. In this case, the insulating material may be a photoimageable dielectric (PID) material. In this case, a fine pitch may be introduced through a photovia, so tens to millions of connection pads 122 of the semiconductor chip 120 may be effectively redistributed. The first insulating layer 141*a* and the second insulating layer 141*b* may have boundaries separated from each other. The first insulating layer 141*a* may be physically spaced apart from the connection pad 122 by the protective film 124. The first insulating layer 141*a* may fill at least a portion of a space between the protective film 124 and the first connection via 143*a* in the first opening 123*h*.

The first redistribution layer 142*a* and the second redistribution layer 142*b* may redistribute the connection pad 122 of the semiconductor chip 120 to be electrically connected to the electrical connection metal 170. A material of the first redistribution layer 142*a* and the second redistribution layer 142*b* may be a metallic material such as copper (Cu), aluminum (Al), silver (Ag), tin (Sn), gold (Au), nickel (Ni), lead (Pb), titanium (Ti), or alloys thereof. The redistribution layer 142 may also perform various functions depending on a design thereof. For example, the redistribution layer may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer may include via pads, electrical connection metal pads, and the like.

The first connection via 143*a* may electrically connect the connection pad 122 of the semiconductor chip 120 to the first redistribution layer 142*a*, formed in different layers, and the second connection via 143*b* may electrically connect the first redistribution layer 142*a* to the second redistribution layer 142*b*, formed in different layers. The first connection via 143*a* may be in physical contact with the connection pad 122 when the semiconductor chip 120 is a bare die. A material of the connection via 143 may also be a metallic material such as copper (Cu), aluminum (Al), silver (Ag), tin (Sn), gold (Au), nickel (Ni), lead (Pb), titanium (Ti), or alloys thereof. Each of the first connection via 143*a* and the second connection via 143*b* may be a filled type, in which a via hole is completely filled with a metallic material, or a conformal type, in which a metallic material is plated along a wall surface of a via hole. Moreover, a tapered shape may be applied thereto.

Meanwhile, the first redistribution layer 142*a* and the first connection via 143*a* are simultaneously formed using a plating process. In this case, a seed layer and a plating layer 146, formed on the seed layer, may be included. In detail, the seed layer may be formed significantly thin using sputtering on an exposed surface of the connection pad, a wall surface of the via hole, and a surface of the first insulating layer, and may include a titanium (Ti) layer or a double layer of titanium (Ti)/copper (Cu). The plating layer is formed on the seed layer using electrolytic plating, thereby filling the via hole 143*h* and the second opening 124*h*. The second redistribution layer 142*b* and the second connection via 143*b* are simultaneously formed using a plating process in a similar manner. In this case, a seed layer and a plating layer may be included.

The passivation layer 150, as an additional component, may protect the connection structure 140 from external physical or chemical damage. The passivation layer 150 may include an insulating resin and an inorganic filler, but may not include a glass fiber. For example, the passivation layer 150 may be ABF, but is not limited thereto. The passivation layer 150 may have a third opening 150*h* exposing at least a portion of the second redistribution layer 142*b*.

The underbump metal layer 160, as an additional component, may improve connection reliability of the electrical connection metal 170 to improve board level reliability of the semiconductor package 100A. The number of the underbump metal 160 may be several tens to several millions. Each of the underbump metals 160 may be connected to the second redistribution layer 142*b* through the third opening 150*h* passing through the passivation layer 150. The underbump metal 160 may be formed by any known metallization method using a metal, but is not limited thereto.

The electrical connection metal 170 physically and/or electrically connects the semiconductor package 100A to an external power source. For example, the semiconductor package 100A may be mounted on the mainboard of the electronic device through the electrical connection metal 170. The electrical connection metal 170 may be formed of a low melting point metal, for example, tin (Sn) or an alloy including tin (Sn). In more detail, the electrical connection structure may be formed of a solder, or the like. However, this is only an example, and a material of the electrical connection structure is not particularly limited thereto. Each of the electrical connection metals 170 may be a land, a ball, a pin, or the like. The electrical connection metals 170 may be formed as a multilayer or single layer structure. When the electrical connection metal includes the plurality of layers, the electrical connection metal includes a copper pillar and a solder. When the electrical connection metal includes the single layer, the electrical connection metal includes a tin-silver solder or copper. However, the electrical connection metal is only an example, and the present disclosure is not limited thereto. The number, an interval, a disposition form, and the like, of electrical connection metal 170 are not particularly limited, but may be sufficiently modified depending on design particulars by those skilled in the art. For example, the electrical connection metals 170 may be provided in an amount of several tens to several thousands according to the number of connection pads 122, or may be provided in an amount of several tens to several thousands or more or several tens to several thousands or less.

At least one of the electrical connection metals 170 may be disposed in a fan-out region. The fan-out region refers to a region, except for a region in which the semiconductor chip 120 is disposed. For example, the semiconductor package 100A according to an exemplary embodiment may be a fan-out semiconductor package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Figure 11:
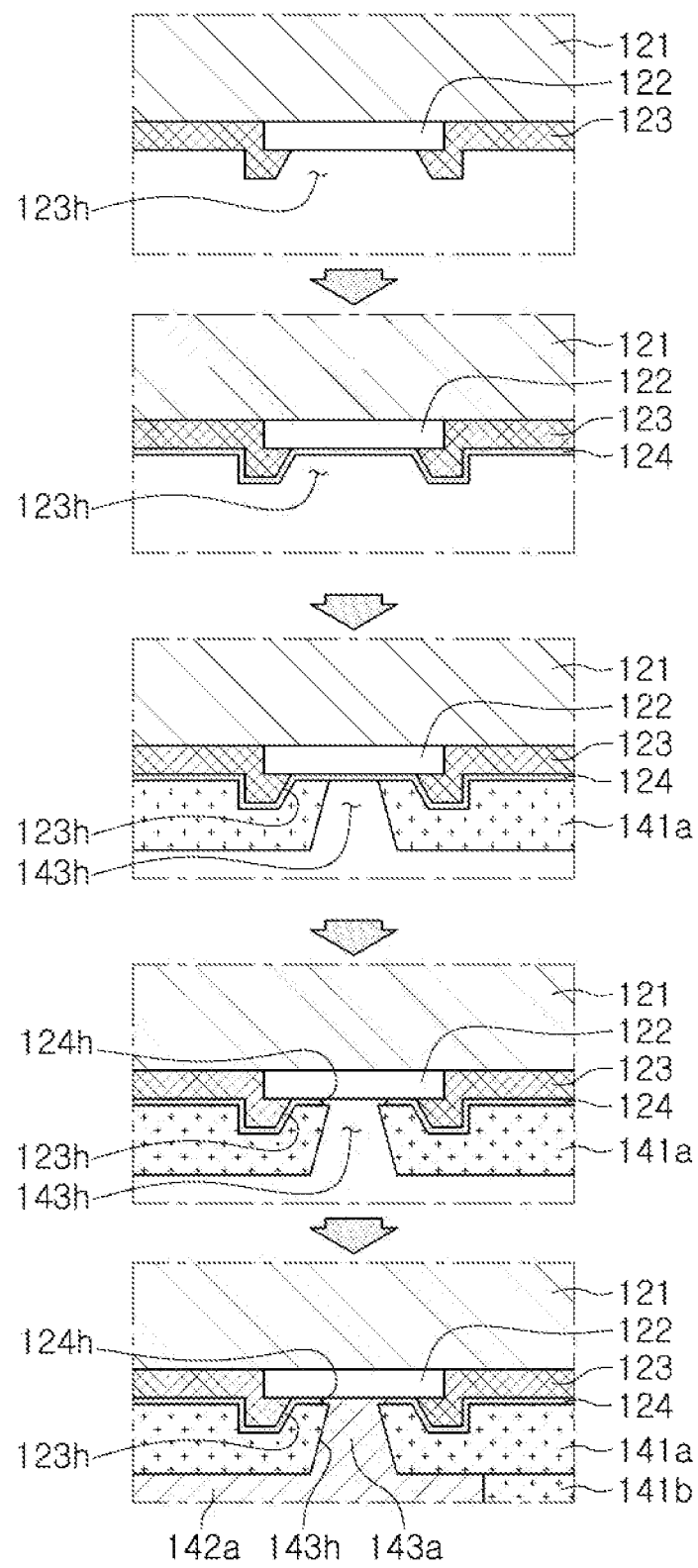
FIG. 11 is a schematic process chart illustrating a portion of a process of manufacturing the semiconductor package of FIG. 9.

FIG. 11 is a schematic process chart illustrating a portion of a process of manufacturing the semiconductor package of FIG. 9.

Referring to FIG. 11, first, in a chip state, for example, a wafer state, on the passivation film 123, a protective film 124, covering the passivation film 123 and the connection pad 122, is formed. The protective film 124 is formed to completely cover a surface of the connection pad 122, having been exposed, and a wall surface of the first opening 123h of the passivation film 123. Then, a first insulating layer 141a is formed on the protective film 124. In this case, as the connection pad 122 is covered by the protective film 124, a contamination problem, occurring in a process of formation of the first insulating layer 141a and the via hole 143h, may be significantly reduced. After the first insulating layer 141a is formed, a via hole 143h is formed using a photolithography method. Then, the protective film 124 is selectively removed using etching from a region of the via hole 143h, thereby forming a second opening 124h exposing the connection pad 122. In this case, by forming an undercut, a wall surface of the second opening 124h is allowed to be recessed toward a wall surface of the first opening 123h. Then, using sputtering, a seed layer is formed, while, using a plating process such as a Semi Additive Process (SAP) or a Modified Semi Additive Process (MSAP), a first connection via 143a, filling the via hole 143h and the second opening 124h, and a first redistribution layer 142a, disposed on the first insulating layer 141a, are formed. The first connection via 143a may include a first portion filling the second opening 124h and a second portion filling the via hole 143h. The first portion and the second portion of the first connection via 143a may be tapered in opposite directions. Then, a second insulating layer 141b is formed. As described above through a series of processes, in a chip state, the connection pad 122 is first protected by the protective film 124, and then the connection structure 140 is formed. Thus, a contamination problem of the connection pad 122 may be effectively solved. Moreover, a recessed space is formed when the second opening 124h of the protective film 124 is formed. Thus, the recessed space is filled with the first connection via 143a, thereby improving reliability and reducing resist distribution.

Figure 12:
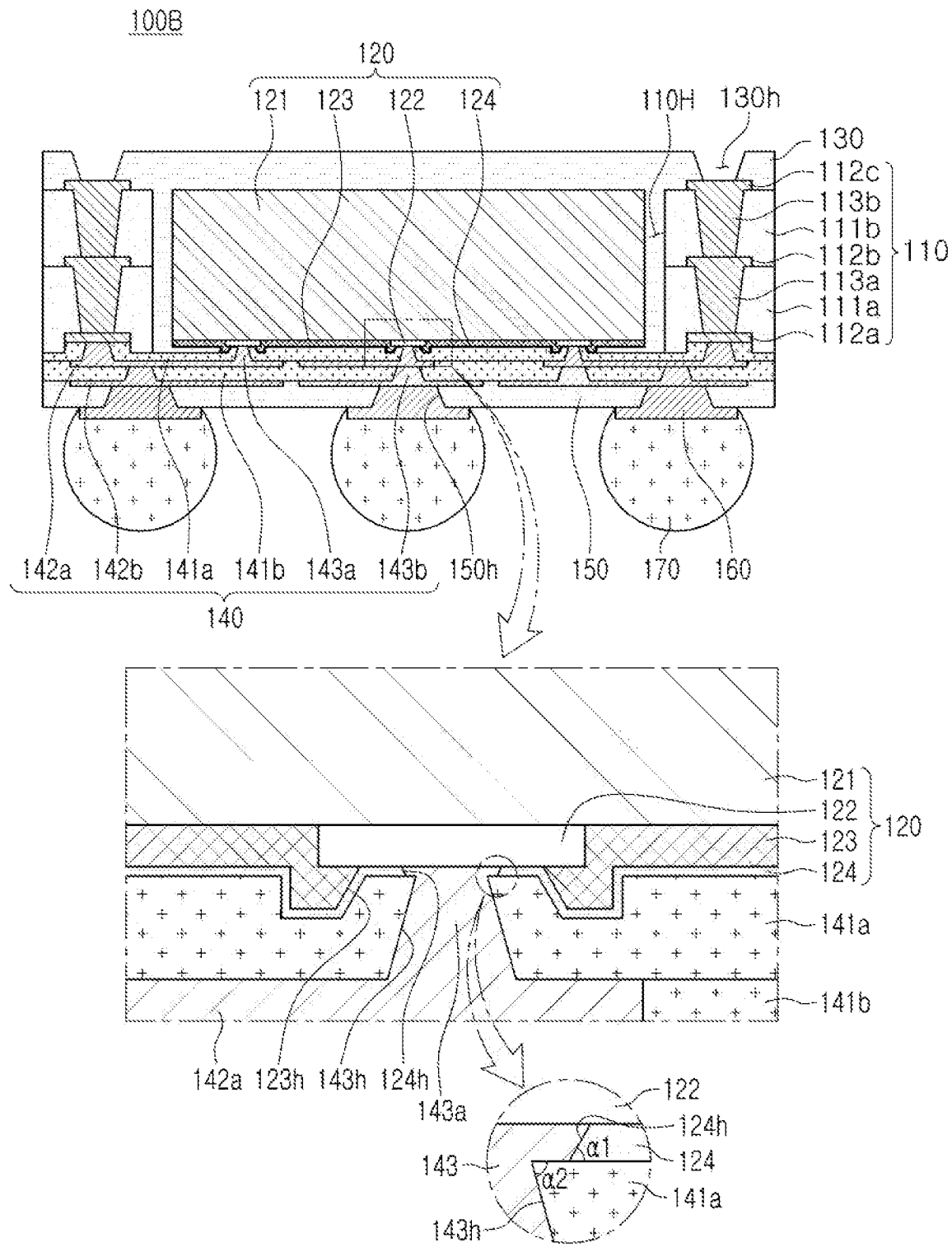
FIG. 12 illustrates another example of a fan-out semiconductor package.

FIG. 12 schematically illustrates another example of a semiconductor package.

Referring to FIG. 12, a semiconductor package 100B according to another example may have a frame 110 having a shape different from that of the semiconductor package 100A according to an example, described above. In detail, the frame 110 may include a plurality of wiring layers 112a, 112b, and 112c, electrically connected to the connection pad 122. In other words, the frame 110 may include wiring layers 112a, 112b, and 112c as well as wiring vias 113a and 113b, in addition to the insulating layers 111a and 111b, and may thus function as a connection structure. In this case, the wiring layers 112a, 112b, and 112c, as well as the wiring vias 113a and 113b may function as an electrical connection member.

In more detail, a frame 110 may include a first insulating layer 111a in contact with the connection structure 140, a first wiring layer 112a in contact with the connection structure 140 and embedded in the first insulating layer 111a, a second wiring layer 112b disposed on a side of the first insulating layer 111a opposite to a side of the first insulating layer 111a in which the first wiring layer 112a is embedded, a second insulating layer 111b disposed on a side of the first insulating layer 111a opposite to a side of the first insulating layer 111a in which the first wiring layer 112a is embedded and covering at least a portion of the second wiring layer 112b, and a third wiring layer 112c disposed on a side of the second insulating layer 111b opposite to a side of the second insulating layer 111b in which the second wiring layer 112b is embedded. The first wiring layer 112a and the second wiring layer 112b, as well as the second wiring layer 112b and the third wiring layer 112c may be electrically connected to each other through the first wiring via 113a and the second wiring via 113b, passing through the first insulating layer 111a and the second insulating layer 111b, respectively. The first to third wiring layers 112a, 112b, and 112c may be electrically connected to the connection pad 122 through the first redistribution layer 142a and the second redistribution layer 142b of the connection structure 140.

A material of each of the first insulating layer 111a and the second insulating layer 111b is not particularly limited. For example, an insulating material may be used as the material of each of the first and second insulating layers. In this case, the insulating material may be a thermosetting resin such as an epoxy resin, a thermoplastic resin such as a polyimid resin, or a resin in which the thermosetting resin or the thermoplastic resin is mixed with an inorganic filler, for example, an Ajinomoto Build-Up film (ABF), or the like. Alternatively, the insulating material may be a material in which the thermosetting resin or the thermoplastic resin is impregnated together with an inorganic filler in a core material such as a glass fiber (or a glass cloth or a glass fabric), for example, a prepreg. A lower surface of the first insulating layer 111a is coplanar with a lowermost surface of the protective film 124 of the semiconductor chip 120. In this regard, because the protective film 124 is formed in a chip state.

The first to third wiring layers 112a, 112b, and 112c may provide an upper/lower electrical connection path of a package with the first wiring via 113a and the second wiring via 113b, and may serve to redistribute the connection pad 122. A material of the first to third wiring layers 112a, 112b, and 112c may be a metallic material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layer may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers may include via pads, wire pads, electrical connection metal pads, and the like. The first to third wiring layers 112a, 112b, and 112c may be formed using a known plating process, and each may be formed of a seed layer and a plating layer. A thickness of each of the first to third wiring layers 112a, 112b, and 112c may be thicker than a thickness of each of the first redistribution layer 142a and the second redistribution layer 142b. The first wiring layer 112a may be recessed inwardly of the first insulating layer 111a. As described above, when the first wiring layer 112a is recessed inwardly of the first insulating layer 111a and a step is provided between a lower surface of the first insulating layer 111a and a lower surface of the first wiring layer 112a, the first wiring layer 112a may be prevented from being contaminated by bleeding of a formation material of the first encapsulant 131.

The first wiring via 113a and the second wiring via 113b may electrically connect the first to wiring layers 112a, 112b, and 112c, formed on different layers, to each other, resulting in an electrical path in the frame 110. A material of the first wiring via 113a and the second wiring via 113b may be a metallic material such as copper (Cu), aluminum (Al), silver (Ag), tin (Sn), gold (Au), nickel (Ni), lead (Pb), titanium (Ti), or alloys thereof. Each of the first wiring via 113a and the second wiring via 113b may be a via in a filled type, filled with a metallic material, or may be a via in a conformal type, in which a metallic material is formed along a wall surface of a via hole. Moreover, a tapered shape may be applied thereto. The first wiring via 113a and the second wiring via 113b may also be formed using a known plating process, and each may be formed of a seed layer and a plating layer.

When a hole for the first wiring via 113a is formed, some pads of the first wiring layer 112a may serve as a stopper. In this regard, it may be advantageous in a process in that the first wiring via 113a has a tapered shape in which a width of an upper surface is greater than a width of a lower surface. In this case, the first wiring via 113a may be integrated with a pad pattern of the second wiring layer 112b. When a hole for the second wiring via 113b is formed, some pads of the second wiring layer 112b may serve as a stopper. In this regard, it may be advantageous in a process in that the second wiring via 113b has a tapered shape in which a width of an upper surface is greater than a width of a lower surface. In this case, the second wiring via 113b may be integrated with a pad pattern of the third wiring layer 112c.

The encapsulant 130 may have a fourth opening 130h, exposing at least a portion of the third wiring layer 112c of the frame 110, and a surface treatment layer (not shown) such as nickel (Ni)/gold (Au) may be formed on a surface of the third wiring layer 112c, exposed by the fourth opening 130h. Other contents overlap those described above with reference to FIGS. 9 to 11, and a detailed description thereof is thus omitted.

Figure 13:
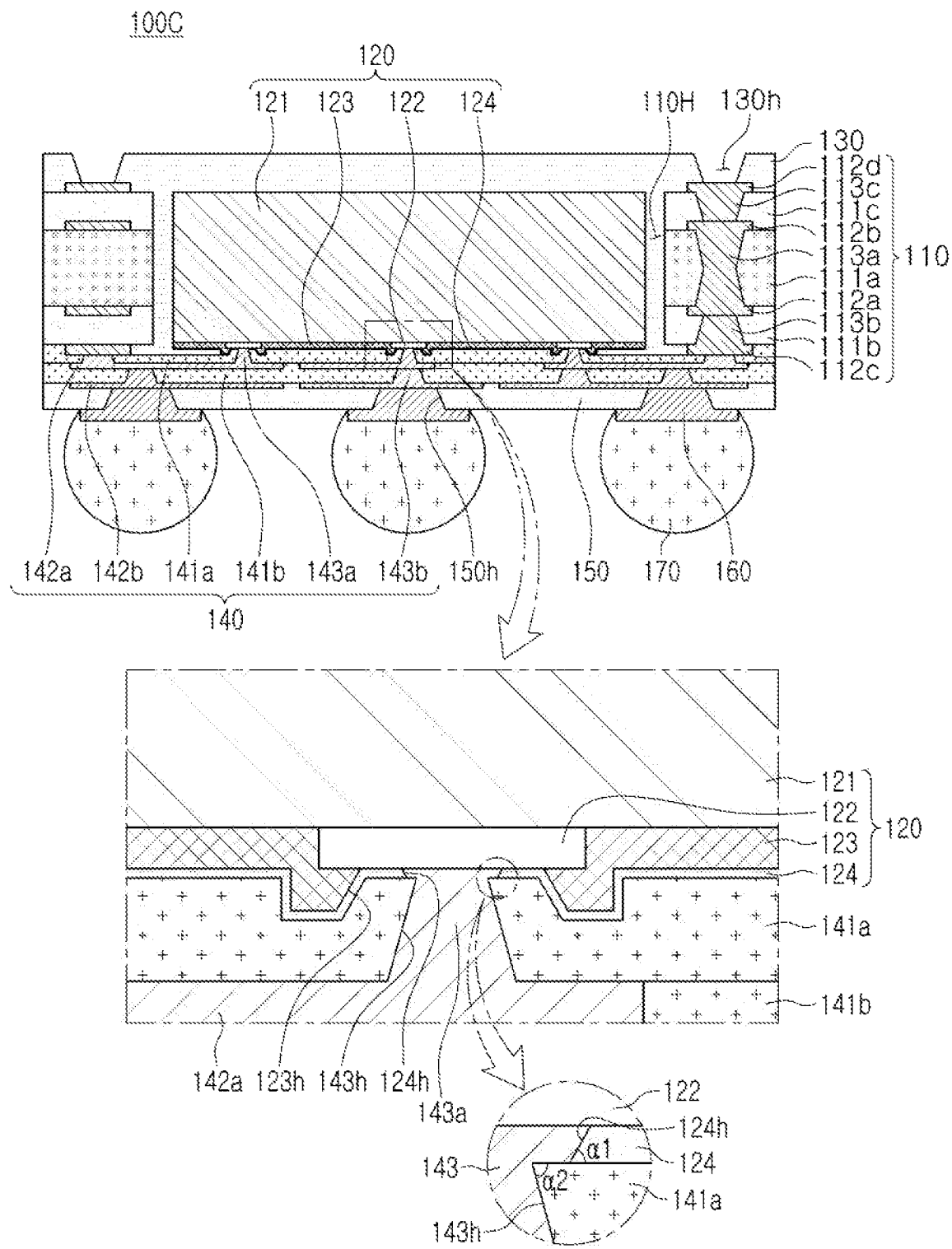
FIG. 13 illustrates another example of a fan-out semiconductor package.

FIG. 13 schematically illustrates another example of a semiconductor package. Referring to FIG. 13, a semiconductor package 100C according to another example may also have a frame 110 having a shape different from that of the semiconductor package 100A according to an example, described above. In detail, the frame 110 may include a plurality of wiring layers 112a, 112b, 112c, and 112d electrically connected to the connection pad 122. In other words, the frame 110 may include wiring layers 112a, 112b, 112c, and 112d as well as wiring vias 113a, 113b, and 113c in addition to the insulating layers 111a, 111b, and 111c, and may thus function as a connection structure. In this case, the wiring layers 112a, 112b, 112c, and 112d as well as the wiring vias 113a, 113b, and 113c may function as an electrical connection member.

In more detail, the frame 110 includes a first insulating layer 111a, a first wiring layer 112a disposed on a lower surface of the first insulating layer 111a, a second wiring layer 112b disposed on an upper surface of the first insulating layer 111a, a second insulating layer 111b disposed on a lower surface of the first insulating layer 111a and covering at least a portion of the first wiring layer 112a, a third wiring layer 112c disposed on a lower surface of the second insulating layer 111b, a third insulating layer 111c disposed on an upper surface of the first insulating layer 111a and covering at least a portion of the second wiring layer 112b, a fourth wiring layer 112d disposed on an upper surface of the third insulating layer 111c, a first wiring via 113a passing through the first insulating layer 111a and electrically connecting the first wiring layer 112a to the second wiring layer 112b, a second wiring via 113b passing through the second insulating layer 111b and electrically connecting the first wiring layer 112a to the third wiring layer 113c, and a third wiring via 113c passing through the third insulating layer 111c and electrically connecting the second wiring layer 112b to the fourth wiring layer 112d. Since the frame 110 may include a further large number of wiring layers 112a, 112b, 112c, and 112d, a connection structure 140 may be further simplified.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. Similarly, the first wiring via 113a passing through the first insulating layer 111a may have a diameter greater than those of the second and third wiring vias 113b and 113c passing through the second and third insulating layers 111b and 111c, respectively. The first wiring via 113a may have an hourglass shape or a cylindrical shape, while the second and third connection via layers 113b and 113c may have tapered shapes of which directions are opposite to each other. A thickness of each of the first to fourth wiring layers 112a, 112b, 112c and 112d may be thicker than a thickness of each of the first redistribution layer 142a and the second redistribution layer 142b. A lower surface of the third wiring layer 112c is coplanar with a lowermost surface of the protective film 124 of the semiconductor chip 120. In this regard, because the protective film 124 is formed in a chip state. Other contents, including a material or a role of the first to fourth wiring layers 112a, 112b, 112c, and 112d and the first to third wiring vias 113a, 113b, and 113c, as well as the fourth opening 130h, and the like overlap those described above with reference to FIGS. 9 to 12, and a detailed description thereof is thus omitted.

As set forth above, according to an exemplary embodiment, a new semiconductor package structure, capable of significantly reducing corrosion and damage of a connection pad of a semiconductor chip and improving reliability of a connection via and reducing resist distribution, may be provided.

While exemplary embodiments have been shown and described above, it will be apparent to those skilled in the art that modifications and variations could be made without departing from the scope of the present invention as defined by the appended claims.

What is claimed is:

1. A method of manufacturing a semiconductor package, the method comprising:
    forming a protective layer on a passivation layer and a connection pad of a semiconductor chip exposed by a first opening of the passivation layer;
    forming an insulating layer on the protective layer;
    forming a via hole penetrating the insulating layer to expose the protective layer;
    forming a second opening by removing a portion of the protective layer through the via hole; and
    forming a connection via filling the via hole and the second opening and a redistribution layer on the connection via,
    wherein the second opening and the via hole are connected to have a stepped portion,
    wherein the first opening has a width narrower closer to the connection pad, and
    wherein the second opening has a width wider closer to the connection pad.

2. The method of claim 1, wherein a wall surface of the second opening is recessed toward a wall surface of the first opening to form a recessed region,
    wherein the recessed region is formed between the insulating layer and the connection pad, and
    wherein the connection via is formed to fill at least a portion of the recessed region.

3. The method of claim 2, wherein the protective layer and the insulating layer include different materials.

4. The method of claim 1, wherein, in a connection point of the second opening and the via hole, a width of the second opening is greater than a width of the via hole.

5. The method of claim 4, wherein the second opening and the via hole are tapered in opposite directions.

6. The method of claim 4, wherein the via hole has a width narrower closer to the connection pad.

7. The method of claim 1, wherein a region, excluding a region exposed by the second opening, of a region exposed by the first opening of the connection pad, is covered by a bent portion of the protective layer in contact with the connection pad in the first opening.

8. The method of claim 7, wherein the insulating layer is physically spaced apart from the connection pad.

9. The method of claim 1, wherein the protective layer has a thickness thinner than a thickness of the passivation layer.

10. The method of claim 1, wherein the protective layer is formed of at least one of $SiO_2$, SiN, $TiO_2$, ZnO, $Al_2O_3$, and polymers.

11. The method of claim 1, wherein the connection via and the redistribution layer are simultaneously formed using a plating process.

12. The method of claim 1, wherein forming the connection via and the redistribution layer includes:
    forming a seed layer to cover an exposed surface of the connection pad, a side surface of the via hole, and a surface of the insulating layer; and
    forming a plating layer on the seed layer using electrolytic plating.

13. A method of manufacturing a semiconductor package, the method comprising:
    forming a protective layer on a passivation layer and a connection pad of a semiconductor chip exposed by a first opening of the passivation layer;
    forming an insulating layer on the protective layer;
    forming a via hole penetrating the insulating layer to expose the protective layer;
    forming a second opening by removing a portion of the protective layer through the via hole; and
    forming a connection via filling the via hole and the second opening and a redistribution layer on the connection via,
    wherein the connection via has a portion having a width smaller than a width of an uppermost portion of the connection via in contact with the connection pad and a width of a lowermost portion of the connection via in contact with the redistribution layer,
    wherein the protective layer includes a bent portion in contact with the connection pad in the first opening.

14. The method of claim 13, wherein the insulating layer is physically spaced apart from the connection pad.

15. The method of claim 13, wherein a portion of the connection pad exposed by the passivation layer has a width greater than a portion of the connection pad exposed by the protective layer.

16. The method of claim 13, wherein a wall surface of the second opening is recessed toward a wall surface of the first opening to form a recessed region,
    wherein the recessed region is formed between the insulating layer and the connection pad, and
    wherein the connection via is formed to fill at least a portion of the recessed region.

17. The method of claim 16, wherein the protective layer and the insulating layer include different materials.

18. The method of claim 13, wherein the semiconductor package is a fan-out semiconductor package.

19. A method of manufacturing a semiconductor package, the method comprising:
    forming a protective layer on a passivation layer and a connection pad of a semiconductor chip exposed by a first opening of the passivation layer;
    forming an insulating layer on the protective layer;
    forming a via hole penetrating the insulating layer to expose the protective layer;
    forming a second opening by removing a portion of the protective layer through the via hole; and
    forming a connection via filling the via hole and the second opening and a redistribution layer on the connection via,
    wherein the protective layer includes a bent portion in contact with the connection pad in the first opening,
    wherein a wall surface of the second opening is recessed toward a wall surface of the first opening to form a recessed region,
    wherein the recessed region is formed between the insulating layer and the connection pad, and
    wherein the connection via is formed to fill at least a portion of the recessed region.

20. The method of claim 19, wherein, in a connection point of the second opening and the via hole, a width of the second opening is greater than a width of the via hole.

* * * * *